United States Patent
Zhang et al.

(10) Patent No.: US 11,256,150 B2
(45) Date of Patent: Feb. 22, 2022

(54) ARRAY SUBSTRATE, METHOD OF MANUFACTURING THE SAME AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xinxia Zhang, Beijing (CN); Bo Yang, Beijing (CN); Meng Geng, Beijing (CN); Qun Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/996,307

(22) Filed: Aug. 18, 2020

(65) Prior Publication Data
US 2021/0157183 A1 May 27, 2021

(30) Foreign Application Priority Data
Nov. 22, 2019 (CN) .......................... 201911159325.3

(51) Int. Cl.
*G02F 1/1362* (2006.01)
*H01L 27/12* (2006.01)
(52) U.S. Cl.
CPC .......... *G02F 1/1362* (2013.01); *H01L 27/124* (2013.01); *G02F 2201/123* (2013.01); *G02F 2201/52* (2013.01)

(58) Field of Classification Search
CPC ................................................ G02F 1/134309
See application file for complete search history.

(56) References Cited

U.S. PATENT DOCUMENTS

| | | | |
|---|---|---|---|
| 2005/0225708 A1* | 10/2005 | Oke | .................. G02F 1/134363 349/139 |
| 2016/0070144 A1* | 3/2016 | Jin | ........................ H01L 29/786 349/144 |
| 2017/0045787 A1* | 2/2017 | Kita | ........................ G09G 3/36 |

* cited by examiner

*Primary Examiner* — James A Dudek
(74) *Attorney, Agent, or Firm* — Muncy, Geissler, Olds & Lowe, P.C.

(57) ABSTRACT

An array substrate, a manufacturing method and a display device are provided in the present disclosure. The array substrate includes first subpixels and second subpixels arranged in rows and columns, each first subpixel includes a first pixel electrode provided with a plurality of first slits arranged parallel to each other, each second subpixel includes a second pixel electrode provided with a plurality of second slits arranged parallel to each other, each first slit is angled at a first tilt angle relative to a reference direction, each second slit is angled at a second tilt angle relative to the reference direction, the first tilt angle is supplementary to the second tilt angle, and the reference direction is an extension direction of each gate line of the array substrate. At least one first subpixel and at least one second subpixel are arranged in each row, and/or at least one first subpixel and at least one second subpixel are arranged in each column.

18 Claims, 6 Drawing Sheets

ARRAY SUBSTRATE, METHOD OF MANUFACTURING THE SAME AND DISPLAY DEVICE

CROSS-REFERENCE TO RELATED APPLICATION

The present application claims a priority of the Chinese patent application No. 201911159325.3 filed on Nov. 22, 2019, which is incorporated herein by reference in its entirety.

TECHNICAL FIELD

The present disclosure relates to the field of display technology, in particular to an array substrate, a method of manufacturing the same and a display device.

BACKGROUND

Currently, for a Liquid Crystal Display (LCD), as one of mainstream display devices, its pixel structure mainly includes a single-domain structure and a double-domain structure. When a pixel is of the single-domain structure, it means that a pixel electrode of the pixel is angled relative to an extension direction of a gate line by merely one angle, and when the pixel is of the double-domain structure, it means that the pixel electrode of the pixel is angled relative to the extension direction of the gate line by two angles.

SUMMARY

In one aspect, an array substrate is provided in some embodiments of the present disclosure, including first subpixels and second subpixels arranged in rows and columns, each first subpixel includes a first pixel electrode provided with a plurality of first slits arranged parallel to each other, each second subpixel includes a second pixel electrode provided with a plurality of second slits arranged parallel to each other, each first slit is angled at a first tilt angle relative to a reference direction, each second slit is angled at a second tilt angle relative to the reference direction, the first tilt angle is supplementary to the second tilt angle, and the reference direction is an extension direction of each gate line of the array substrate. At least one first subpixel and at least one second subpixel are arranged in each row, and/or at least one first subpixel and at least one second subpixel are arranged in each column.

In a possible embodiment of the present disclosure, the first subpixels and the second subpixels are arranged alternately in each row.

In a possible embodiment of the present disclosure, first subpixel groups and second subpixel groups are arranged alternately in each row, each first subpixel group includes n consecutive first subpixels, and each second subpixel group includes n consecutive second subpixels, where n is an integer greater than or equal to 2.

In a possible embodiment of the present disclosure, n is a multiple of 3.

In a possible embodiment of the present disclosure, n is 3, three first subpixels in each first subpixel group form one pixel unit, and three second subpixels in each second subpixel group form one pixel unit.

In a possible embodiment of the present disclosure, the three first subpixels in each first subpixel group include a red subpixel, a green subpixel and a blue subpixel, and the three second subpixels in each second subpixel group include a red subpixel, a green subpixel and a blue subpixel.

In a possible embodiment of the present disclosure, the first subpixels and the second subpixels are arranged alternately in each column.

In a possible embodiment of the present disclosure, third subpixel groups and fourth subpixel groups are arranged alternately in each column, each third subpixel group includes m consecutive first subpixels, and each fourth subpixel group includes m consecutive second subpixels, where m is an integer greater than or equal to 2.

In another aspect, a display device is provided in some embodiments of the present disclosure, including the above-mentioned array substrate.

In yet another aspect, a method of manufacturing an array substrate is provided in some embodiments of the present disclosure, including forming first subpixels and second subpixels in rows and columns. Each first subpixel includes a first pixel electrode provided with a plurality of first slits arranged parallel to each other, each second subpixel includes a second pixel electrode provided with a plurality of second slits arranged parallel to each other, each first slit is angled at a first tilt angle relative to a reference direction, each second slit is angled at a second tilt angle relative to the reference direction, the first tilt angle is supplementary to the second tilt angle, and the reference direction is an extension direction of each gate line of the array substrate. At least one first subpixel and at least one second subpixel are arranged in each row, and/or at least one first subpixel and at least one second subpixel are arranged in each column.

In a possible embodiment of the present disclosure, the first subpixels and the second subpixels are arranged alternately in each row.

In a possible embodiment of the present disclosure, the first subpixels and the second subpixels are arranged alternately in each column.

In a possible embodiment of the present disclosure, first subpixel groups and second subpixel groups are arranged alternately in each row, each first subpixel group comprises n consecutive first subpixels, and each second subpixel group comprises n consecutive second subpixels, where n is an integer greater than or equal to 2.

In a possible embodiment of the present disclosure, third subpixel groups and fourth subpixel groups are arranged alternately in each column, each third subpixel group comprises m consecutive first subpixels, and each fourth subpixel group comprises m consecutive second subpixels, where m is an integer greater than or equal to 2.

BRIEF DESCRIPTION OF THE DRAWINGS

Through the detailed description mentioned hereinafter, other advantages and benefits will be apparent to a person skilled in the art. The following drawings are for illustrative purposes only, but shall not be construed as limiting the present disclosure. In the drawings, a same reference numeral represents a same member. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the related art, a liquid crystal display of a single-domain pixel structure has high light transmittance, but there is chromatic aberration. Especially, contrast of the liquid crystal display decreases seriously at a large viewing angle. In order to prevent the occurrence of the chromatic aberration for the liquid crystal display of the single-domain pixel structure, the pixel structure may be designed as a double-domain structure. Due to an anchoring effect of an alignment material (e.g., polyimide (PI)), liquid crystals (LCs) of the liquid crystal display of the double-domain structure are aligned in a single direction initially. When each Thin Film Transistor (TFT) has been turned on, a double-domain effect is achieved for the liquid crystals under the effect of a driving electric field. Through a supplementary effect of domains, it is able for the double-domain pixel structure to inhibit grayscale inversion and chromatic aberration. However, there is a disturbed electric field at a corner between pixel electrodes of pixels of the double-domain structure, so the alignment of the liquid crystals at the corner is disordered and thereby a dark stripe area occurs.

In view of the above-mentioned problems, an array substrate, a method of manufacturing the same and a display device are provided in the present disclosure.

Figure 1:
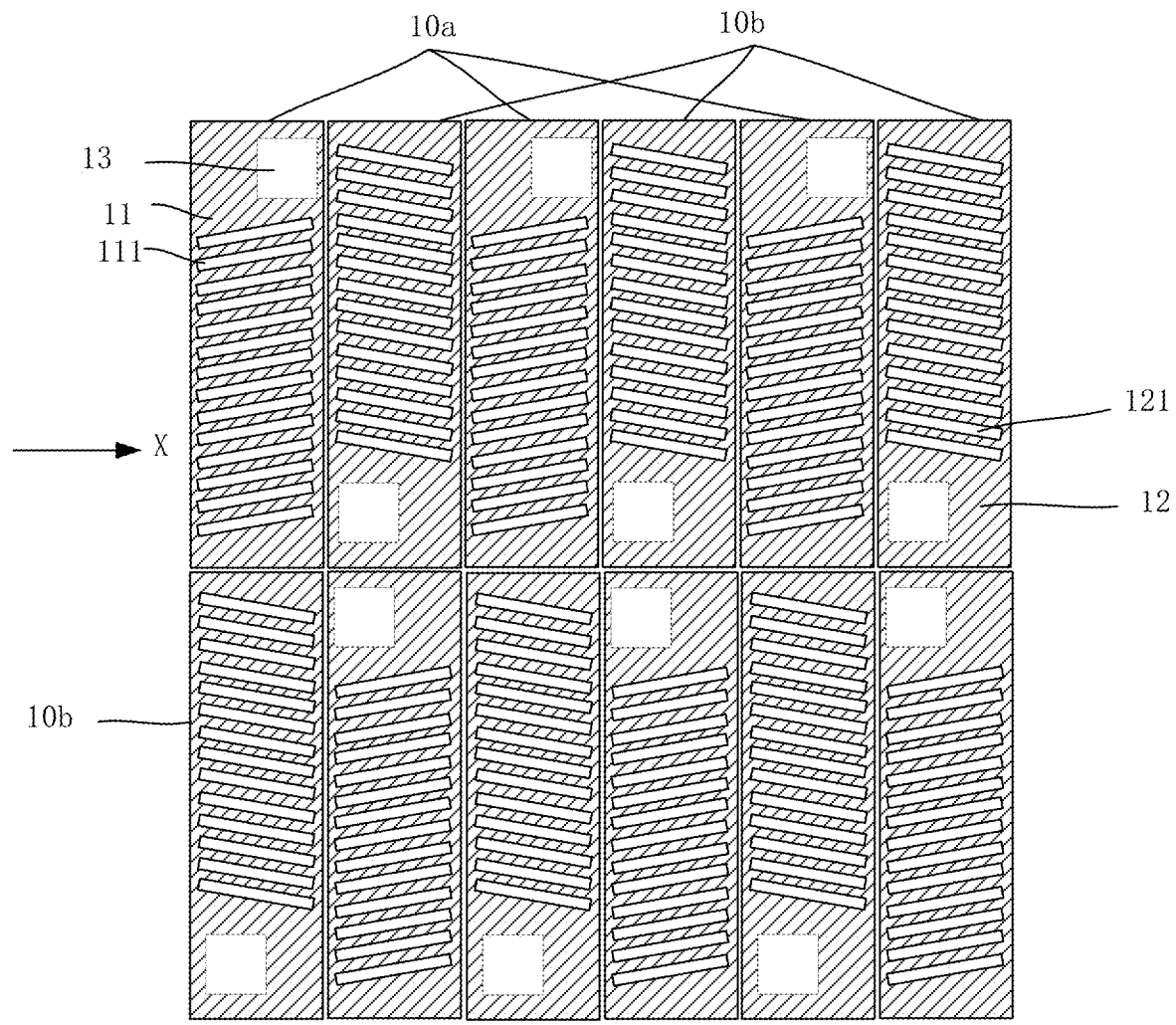
FIG. 1 is a schematic view showing an array substrate according to one embodiment of the present disclosure.

As shown in FIG. 1, an array substrate is provided in some embodiments of the present disclosure, which includes first subpixels 10*a* and second subpixels 10*b* arranged in rows and columns. Each first subpixel 10*a* includes a first pixel electrode 11 provided with a plurality of first slits 111 arranged parallel to each other, each second subpixel 10*b* includes a second pixel electrode 12 provided with a plurality of second slits 121 arranged parallel to each other, each first slit 111 is angled at a first tilt angle relative to a reference direction, each second slit 121 is angled at a second tilt angle relative to the reference direction, the first tilt angle is supplementary to the second tilt angle, and the reference direction is an extension direction of each gate line of the array substrate (i.e., direction X in FIG. 1). At least one first subpixel 10*a* and at least one second subpixel 10*b* are arranged in each row.

Figure 2:
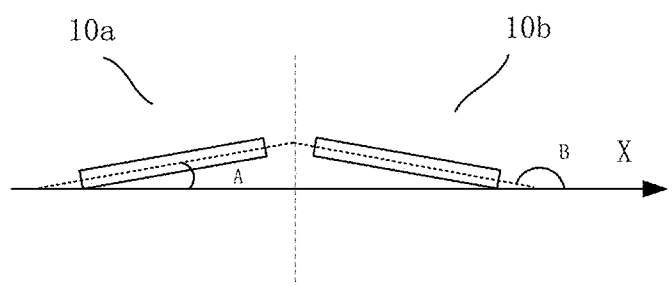
FIG. 2 is a schematic view showing tilt angles of strip-like electrodes according to one embodiment of the present disclosure.

In the embodiments of the present disclosure, as shown in FIG. 2, when the tilt angles are supplementary to each other, it means that a sum of a first tilt angle A of each first slit in the first pixel electrode of the first subpixel 10*a* and a second tilt angle B of each second slit in the second pixel electrode of the second subpixel 10*b* is 180°. In the embodiments of the present disclosure, values of the first tilt angle A and the second tilt angle B may be set according to the practical need.

In the embodiments of the present disclosure, each subpixel may be of a single-domain structure. A liquid crystal display of the single-domain structure has relatively high light transmittance, and it is able to prevent the occurrence of a dark stripe area at a corner between pixel electrodes for a liquid crystal display of a double-domain structure due to a disturbed electric field at the corner. In addition, for the subpixels in each row, the tilt angles of the slits in the pixel electrodes may be supplementary to each other, so brightness values of the subpixels may be supplementary to each other too, and thereby it is able to prevent the occurrence of chromatic aberration as well as the occurrence of horizontal stripes due to a same tilt angle of the subpixels in each row.

In FIG. 1, the first subpixels 10*a* and the second subpixels 10*b* may be arranged alternately in each row, i.e., the tilt angles of the slits in the pixel electrodes of two adjacent subpixels may be supplementary to each other. In this arrangement mode, the brightness values of the two adjacent subpixels in each row may be supplementary to each other, so as to prevent the occurrence of the horizontal stripes.

Figure 3:
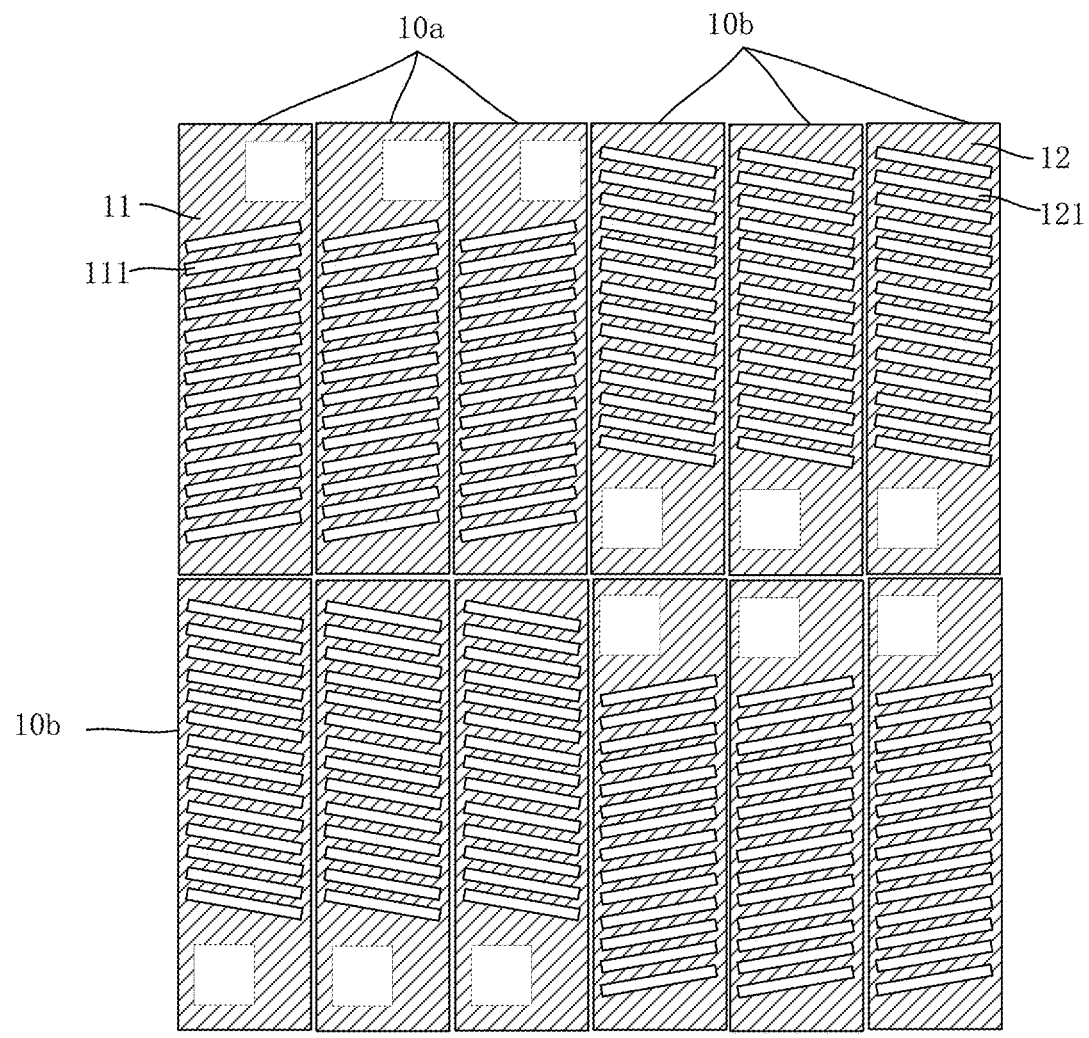
FIG. 3 is another schematic view showing the array substrate according to one embodiment of the present disclosure.

In some other embodiments of the present disclosure, the first subpixels 10*a* and the second subpixels 10*b* may not be arranged alternately in each row, and instead, they may be arranged in some other modes. For example, as shown in FIG. 3, first subpixel groups and second subpixel groups may be arranged in each row, each first subpixel group may include n consecutive first subpixels 10*a*, and each second subpixel group may include n consecutive second subpixels 10*b*, where n is an integer greater than or equal to 2. The first subpixel groups and the second subpixel groups may be arranged alternately.

In a possible embodiment of the present disclosure, n may be 3. Three first subpixels in each first subpixel group may form one pixel unit, i.e., monochromatic light emitted by each of the three first subpixels in each first subpixel group is capable of being mixed to form white light. Three second subpixels in each second subpixel group may form one pixel unit, i.e., monochromatic light emitted by each of the three second subpixels in each second subpixel group is capable of being mixed to form white light.

In a possible embodiment of the present disclosure, the three first subpixels in each first subpixel group may include a red subpixel, a green subpixel and a blue subpixel, and the three second subpixels in each second subpixel group may include a red subpixel, a green subpixel and a blue subpixel.

Hence, when the first subpixels and the second subpixels are arranged alternately, or when the first subpixel groups and the second subpixel groups are arranged alternately and each of the first subpixel groups and the second subpixel groups includes the red subpixel, the green subpixel and the blue subpixel, the brightness values of the adjacent red subpixels, the adjacent green subpixels and the adjacent blue subpixels may be supplementary to each other, so as to prevent the occurrence of the horizontal stripes.

Of course, in some other embodiments of the present disclosure, n may be any other values. For example, it may be a multiple of 3, e.g., 6 or 9. In other words, the tilt angles of the slits in the pixel electrodes of at least two consecutive pixel units may be the same.

Referring to FIG. 1 again, in a possible embodiment of the present disclosure, the first subpixels 10*a* and the second subpixels 10*b* may be arranged in each column, i.e., the tilt angles of the slits in the pixel electrodes of the subpixels in each column may be supplementary to each other, so the brightness values of the subpixels may be supplementary to each other too, and thereby it is able to prevent the occurrence of chromatic aberration as well as the occurrence of longitudinal stripes due to the same tilt angle of the subpixels in each column.

In FIG. 1, the first subpixels 10a and the second subpixels 10b may be arranged alternately in each column, i.e., the tilt angles of the slits in the pixel electrodes of two adjacent subpixels may be supplementary to each other. In this arrangement mode, the brightness values of the two adjacent subpixels in each column may be supplementary to each other, so as to prevent the occurrence of the longitudinal stripes.

In some other embodiments of the present disclosure, the first subpixels 10a and the second subpixels 10b may not be arranged alternately in each column, and instead, they may be arranged in some other modes. For example, third subpixel groups and fourth subpixel groups may be arranged in each column, each third subpixel group may include m consecutive first subpixels 10a, and each fourth subpixel group may include m consecutive second subpixels 10b, where m is an integer greater than or equal to 2. The third subpixel groups and the fourth subpixel groups may be arranged alternately.

Figure 4:
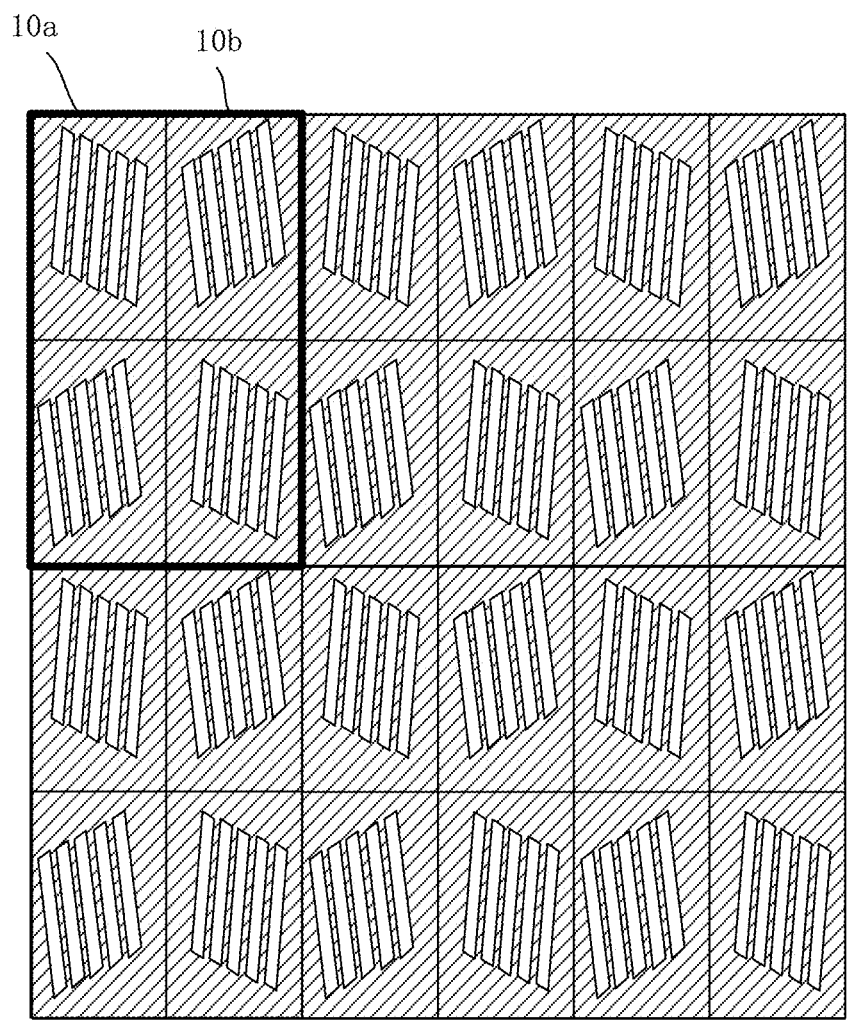
FIGS. 4 and 5 are yet another schematic views showing the array substrate according to one embodiment of the present disclosure.
Figure 5:
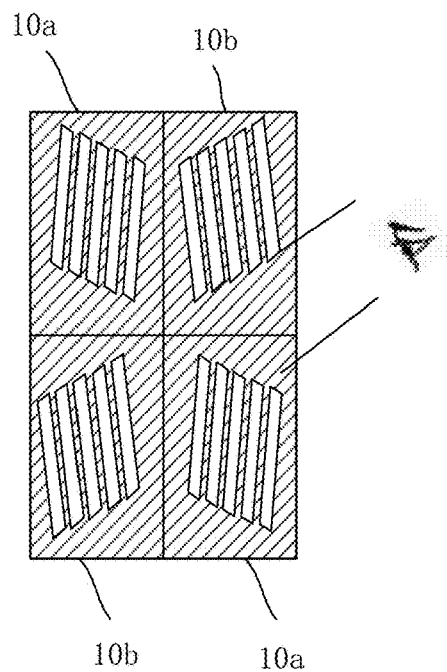

As shown in FIGS. 4 and 5 which show the array substrate according to one embodiment of the present disclosure, the first subpixels 10a and the second subpixels 10b may be arranged alternately in each row, i.e., the tilt angles of the slits in the pixel electrodes of two adjacent subpixels in each row may be supplementary to each other, and the first subpixels 10a and the second subpixels 10b may be arranged alternately in each column, i.e., the tilt angles of the slits in the pixel electrodes of two adjacent subpixels in each column may be supplementary to each other, so as to form the array substrate with a 4-pixel (4P) 4-domain (4D) pixel structure, i.e., form four types of electric fields in four adjacent subpixels (the subpixels in a black-bordered box in FIG. 4). As shown in FIG. 5, in the array substrate with the 4P4D pixel structure, the tilt angles of the slits in the pixel electrodes of the two adjacent subpixels in each row may be supplementary to each other, so it is able for the brightness values of the subpixels to be supplementary to each other, thereby to prevent the occurrence of the horizontal stripes. The tilt angles of the slits in the pixel electrodes of the two adjacent subpixels in each column may be supplementary to each other, so it is able for the brightness values of the subpixels to be supplementary to each other, thereby to prevent the occurrence of the longitudinal stripes.

In the embodiments of the present disclosure, as shown in FIGS. 1 and 3, each pixel electrode may be of a sheet-like shape and provided with a plurality of slots. Of course, in some other embodiments of the present disclosure, the pixel electrode may also be of any other shapes but not limited to the sheet-like shape.

In the embodiments of the present disclosure, as shown in FIGS. 1 and 3, each pixel electrode may be further provided with a hollowed-out region 13 where a TFT is to be placed. One electrode of the TFT may be coupled to the pixel electrode.

Figure 6:
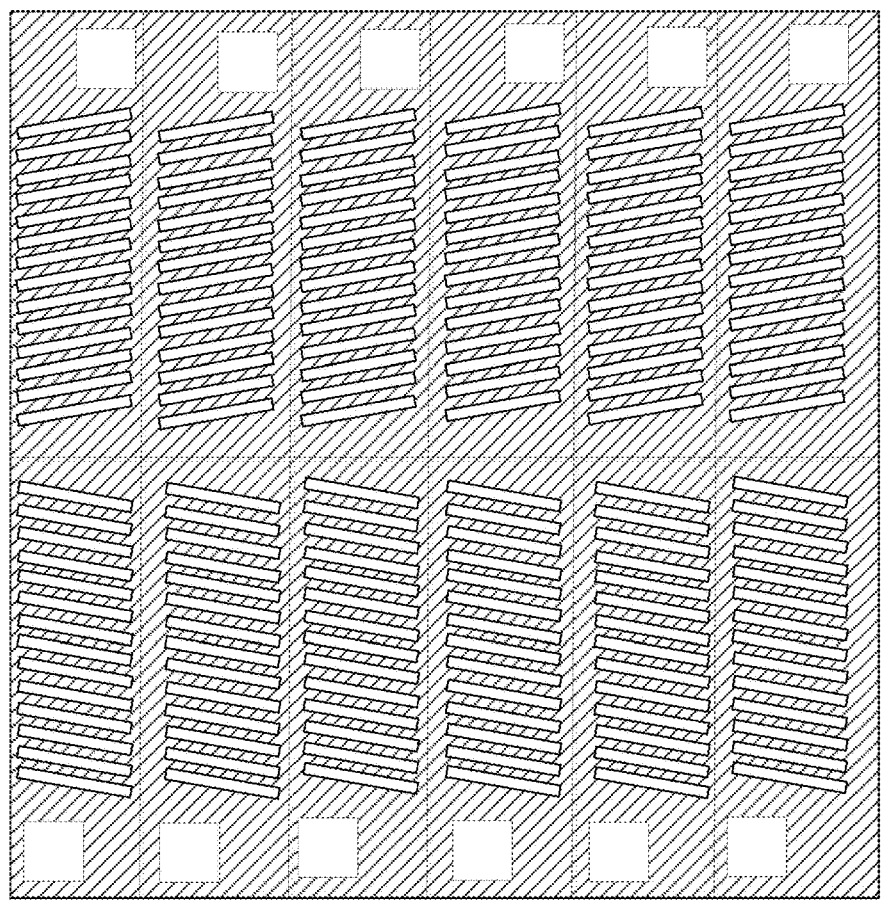
FIG. 6 is a schematic view showing a conventional array substrate according to one embodiment of the present disclosure.
Figure 7:
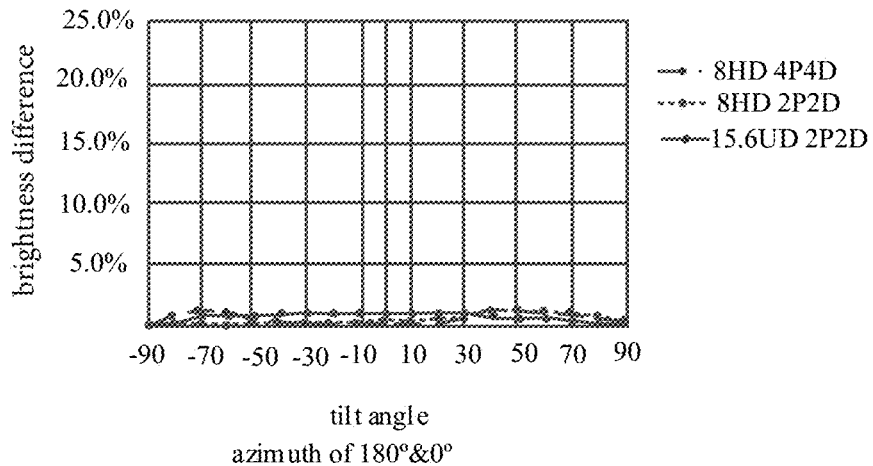
FIGS. 7 to 10 are schematic views showing the simulation of brightness differences between two adjacent rows of subpixels in three types of liquid crystal display devices at different viewing angles according to one embodiment of the present disclosure.
Figure 8:
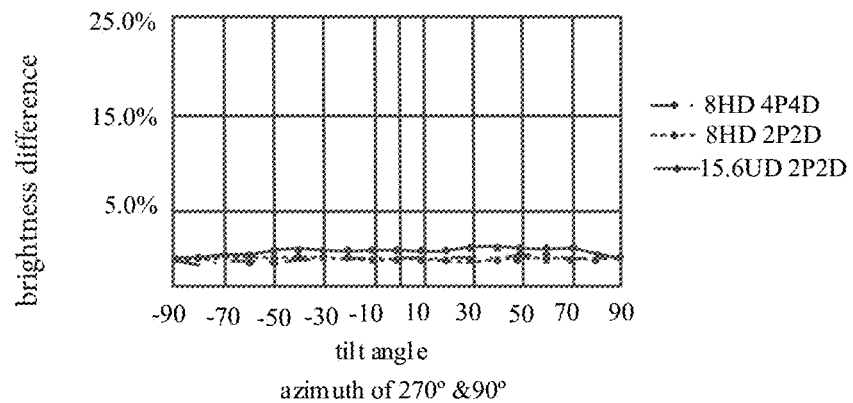
Figure 9:
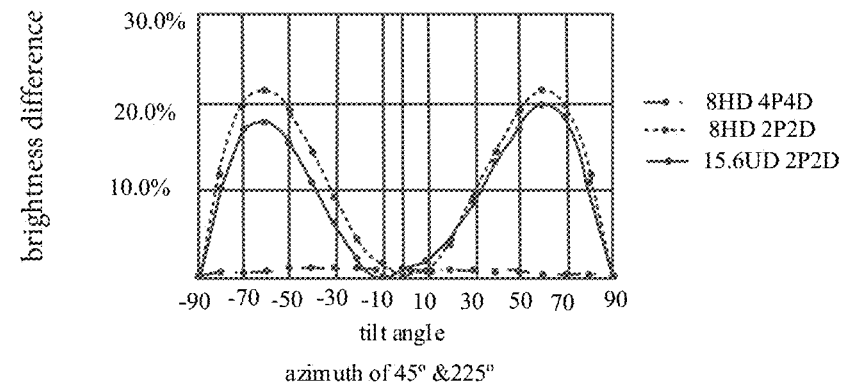
Figure 10:
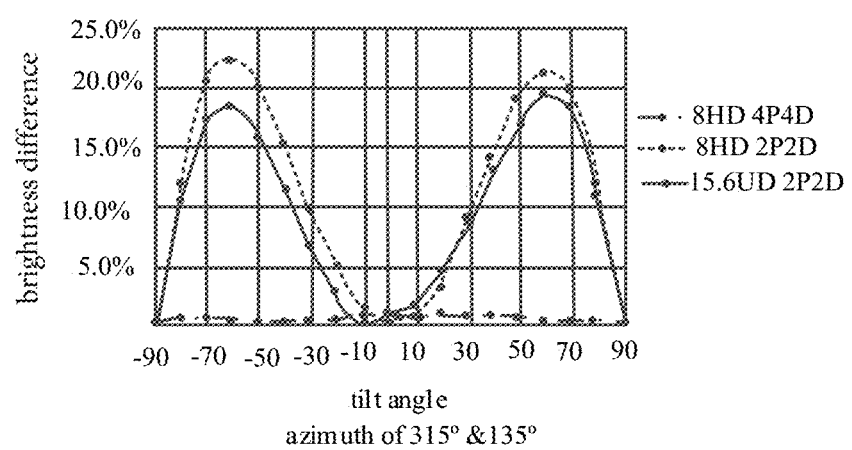

As shown in FIG. 6 which shows a conventional array substrate, tilt angles of slits in pixel electrodes of subpixels in each row are the same, while the tilt angles of the slits in the pixels electrodes of the subpixels in adjacent rows are supplementary to each other. This array substrate may also be called as array substrate with a 2P2D pixel structure. For the array substrate with the 2P2D pixel structure, the tilt angles of the slits in the pixel electrodes of the subpixels in adjacent rows may be different from each other, so the liquid crystals may be aligned in different directions. In this way, it is able to prevent the occurrence of the chromatic aberration and improve the light transmittance due to the single-domain pixel electrode of each individual subpixel. However, the horizontal stripes may easy occur visually.

However, it is able for the array substrate with the 4P4D pixel structure in the embodiments of the present disclosure to prevent the occurrence of the horizontal stripes.

Table 1 shows simulation data about brightness differences between the subpixels in two adjacent rows in liquid crystal displays with the 2P2D pixel structure and a liquid crystal display with the 4P4D pixel structure.

TABLE 1

|  | Brightness difference between subpixels in two adjacent rows | | | | Result |
|---|---|---|---|---|---|
| Viewing angle | Horizontal viewing angle (azimuth: Ø 0°& 180°) | Vertical viewing angle (azimuth: Ø 90°& 270°) | First horizontal squint angle (azimuth: Ø 45° &225°) | Second horizontal squint angle (azimuth: Ø 315° &135°) | |
| 15.6UD@282PPI 2P2D | Max 1.0% @ viewing azimuth of 180° + tilt angle of 20° | Max 1.18% @ viewing azimuth of 90° + tilt angle of 40° | Max 19.6% @ viewing azimuth of 45° + tilt angle of 60° | Max 19.6% @ viewing azimuth of 135° + tilt angle of 60° | No horizontal stripe |
| 8HD@182PPI 2P2D | Max0.85%@ viewing azimuth of 0° + tilt angle of 60° | Max 0.43% @ viewing azimuth of 270° + tilt angle of 50° | Max 22% @ viewing azimuth of 225° + tilt angle of 60° | Max 22.3% @ viewing azimuth of 315° + tilt angle of 60° | Risk of horizontal stripe |
| 8HD@ 182PPI4P4D | Max0.84%@ viewing azimuth of 0° + tilt angle of 60° | Max 0.95% @ viewing azimuth of 90° + tilt angle of 30° | Max 1.12% @ viewing azimuth of 225° + tilt angle of 40° | Max 0.784% @ viewing azimuth of 315° + tilt angle of 10° | No horizontal stripe |

In Table 1, the brightness differences between the subpixels in two adjacent rows are simulated with respect to three types of liquid crystal displays, i.e., a 15.6 Ultra High Definition (15.6UD) (or 282 Pixel Per Inch (PPI)) liquid crystal display with the 2P2D pixel structure, a 8 High Definition (8HD) (or 182 PPI) liquid crystal display with the 2P2D pixel structure, and a 8HD (or 182 PPI) liquid crystal display with the 4P4D pixel structure.

In Table 1, the horizontal viewing angle represents viewing azimuths of 0° and 180°. "Max 1.0%@ viewing azimuth of 180°+tilt angle of 20°'" represents that the brightness difference between the subpixels in two adjacent rows is maximum, i.e., 1%, when viewed at a tilt angle of 20° relative to a Z-axis and at a viewing azimuth of 180°, where an X-axis is a line parallel to a horizontal viewing angle, a Y-axis is a line parallel to a vertical viewing angle, and the X-axis, the Y-axis and the Z-axis are perpendicular to each other.

In addition, for the 15.6UD liquid crystal display with the 2P2D pixel structure, when viewed at a tilt angle of 60° relative to the Z-axis and at a viewing azimuth of 45°, the brightness difference between the subpixels in the two adjacent rows may be 19.6%. However, the definition of the liquid crystal display is relatively high, so no horizontal stripe may be viewed actually. For a product with relatively low definition, e.g., the 8HD liquid crystal display with the 2P2D pixel structure, when the brightness difference between the subpixels in two adjacent rows is 22%, the horizontal stripe may occur.

Hence, for the high-PPI liquid crystal display, e.g., the 282 PPI liquid crystal display in Table 1, when the 2P2D pixel structure is adopted, substantially no horizontal stripe may occur. For the low-PPI liquid crystal display, e.g., the 182 PPI liquid crystal display in Table 1, when the 2P2D pixel structure is adopted, the horizontal stripe may be viewed. Further, as shown in Table 1, when the 4P4D pixel structure in the embodiments of the present disclosure is adopted by the low-PPI liquid crystal display, no horizontal stripe may occur.

As shown in FIGS. 7 to 10 which show the simulations of the brightness differences between the subpixels in two adjacent rows in the above three types of liquid crystal displays at different viewing angles, the brightness difference between the subpixels in two adjacent rows for the 4P4D pixel structure is obviously advantageous over that for the 2P2D pixel structure, so it is able to prevent the occurrence of the horizontal stripes.

A display device is further provided in some embodiments of the present disclosure, including the above-mentioned array substrate.

In the embodiments of the present disclosure, the display device may be an In-Plane Switching (IPS) liquid crystal display, or any other type of liquid crystal display, e.g., High-aperture-ratio Advanced Switching (HADS) or ADS liquid crystal display.

In the embodiments of the present disclosure, the display device may be a vehicle-mounted liquid crystal display.

A method of manufacturing an array substrate is further provided in some embodiments of the present disclosure, which includes forming first subpixels and second subpixels in rows and columns. Each first subpixel includes a first pixel electrode provided with a plurality of first slits arranged parallel to each other, each second subpixel includes a second pixel electrode provided with a plurality of second slits arranged parallel to each other, each first slit is angled at a first tilt angle relative to a reference direction, each second slit is angled at a second tilt angle relative to the reference direction, the first tilt angle is supplementary to the second tilt angle, and the reference direction is an extension direction of each gate line of the array substrate. At least one first subpixel and at least one second subpixel are arranged in each row, and/or at least one first subpixel and at least one second subpixel are arranged in each column.

In some embodiments of the present disclosure, the first subpixels and the second subpixels may be arranged alternately in each row.

In some embodiments of the present disclosure, first subpixel groups and second subpixel groups may be arranged alternately in each row, each first subpixel group may include n consecutive first subpixels, and each second subpixel group may include n consecutive second subpixels, where n is an integer greater than or equal to 2.

In some embodiments of the present disclosure, n may be a multiple of 3.

In some embodiments of the present disclosure, n may be 3, three first subpixels in each first subpixel group may form one pixel unit, and three second subpixels in each second subpixel group may form one pixel unit.

In some embodiments of the present disclosure, the three first subpixels in each first subpixel group may include a red subpixel, a green subpixel and a blue subpixel, and the three second subpixels in each second subpixel group may include a red subpixel, a green subpixel and a blue subpixel.

In some embodiments of the present disclosure, the first subpixels and the second subpixels are arranged alternately in each column.

In some embodiments of the present disclosure, third subpixel groups and fourth subpixel groups may be arranged alternately in each column, each third subpixel group may include m consecutive first subpixels, and each fourth subpixel group may include m consecutive second subpixels, where m is an integer greater than or equal to 2.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising first subpixels and second subpixels arranged in rows and columns,
    wherein each first subpixel comprises a first pixel electrode provided with a plurality of first slits arranged parallel to each other, each second subpixel comprises a second pixel electrode provided with a plurality of second slits arranged parallel to each other, each first slit is angled at a first tilt angle relative to a reference direction, each second slit is angled at a second tilt angle relative to the reference direction, the first tilt angle is supplementary to the second tilt angle, and the reference direction is an extension direction of each gate line of the array substrate,
    wherein at least one first subpixel and at least one second subpixel are arranged in each row, and/or at least one first subpixel and at least one second subpixel are arranged in each column, and
    wherein each first pixel electrode is further provided with a first hollowed-out region, each second pixel electrode is further provided with a second hollowed-out region, the first hollowed-out region and the second hollowed-out region are each a region where a TFT is to be placed, and, in each row, an orthogonal projection of each first hollowed-out region onto a same plane is on a side the first pixel electrode and the second pixel electrode close to a same gate line, and an orthogonal projection of each second hollowed-out region onto the same plane is on an opposite side of the first pixel electrode and the second pixel electrode away from the same gate line.

2. The array substrate according to claim 1, wherein the first subpixels and the second subpixels are arranged alternately in each row.

3. The array substrate according to claim 1, wherein first subpixel groups and second subpixel groups are arranged alternately in each row, each first subpixel group comprises n consecutive first subpixels, and each second subpixel group comprises n consecutive second subpixels, where n is an integer greater than or equal to 2.

4. The array substrate according to claim 3, wherein n is a multiple of 3.

5. The array substrate according to claim 4, wherein n is 3, three first subpixels in each first subpixel group form one pixel unit, and three second subpixels in each second subpixel group form one pixel unit.

6. The array substrate according to claim 5, wherein the three first subpixels in each first subpixel group comprise a red subpixel, a green subpixel and a blue subpixel, and the three second subpixels in each second subpixel group comprise a red subpixel, a green subpixel and a blue subpixel.

7. A display device, comprising the array substrate according to claim 1.

8. A method of manufacturing an array substrate, comprising forming first subpixels and second subpixels in rows and columns,
wherein each first subpixel comprises a first pixel electrode provided with a plurality of first slits arranged parallel to each other, each second subpixel comprises a second pixel electrode provided with a plurality of second slits arranged parallel to each other, each first slit is angled at a first tilt angle relative to a reference direction, each second slit is angled at a second tilt angle relative to the reference direction, the first tilt angle is supplementary to the second tilt angle, and the reference direction is an extension direction of each gate line of the array substrate,
wherein at least one first subpixel and at least one second subpixel are arranged in each row, and/or at least one first subpixel and at least one second subpixel are arranged in each column, and
wherein each first pixel electrode is further provided with a first hollowed-out region, each second pixel electrode is further provided with a second hollowed-out region, the first hollowed-out region and the second hollowed-out region are each a region where a TFT is to be placed, and, in each row, an orthogonal projection of each first hollowed-out region onto a same plane is on a side the first pixel electrode and the second pixel electrode close to a same gate line, and an orthogonal projection of each second hollowed-out region onto the same plane is on an opposite side of the first pixel electrode and the second pixel electrode away from the same gate line.

9. The method according to claim 8, wherein the first subpixels and the second subpixels are arranged alternately in each row.

10. The method according to claim 8, wherein first subpixel groups and second subpixel groups are arranged alternately in each row, each first subpixel group comprises n consecutive first subpixels, and each second subpixel group comprises n consecutive second subpixels, where n is an integer greater than or equal to 2.

11. The array substrate according to claim 2, wherein the first subpixels and the second subpixels are arranged alternately in each column.

12. The array substrate according to claim 3, wherein the first subpixels and the second subpixels are arranged alternately in each column.

13. The array substrate according to claim 1, wherein the first subpixels and the second subpixels are arranged alternately in each column.

14. The array substrate according to claim 1, wherein third subpixel groups and fourth subpixel groups are arranged alternately in each column, each third subpixel group comprises m consecutive first subpixels, and each fourth subpixel group comprises m consecutive second subpixels, where m is an integer greater than or equal to 2.

15. The array substrate according to claim 2, wherein third subpixel groups and fourth subpixel groups are arranged alternately in each column, each third subpixel group comprises m consecutive first subpixels, and each fourth subpixel group comprises m consecutive second subpixels, where m is an integer greater than or equal to 2.

16. The array substrate according to claim 11, wherein third subpixel groups and fourth subpixel groups are arranged alternately in each column, each third subpixel group comprises m consecutive first subpixels, and each fourth subpixel group comprises m consecutive second subpixels, where m is an integer greater than or equal to 2.

17. The method according to claim 9, wherein the first subpixels and the second subpixels are arranged alternately in each column.

18. The method according to claim 10, wherein third subpixel groups and fourth subpixel groups are arranged alternately in each column, each third subpixel group comprises m consecutive first subpixels, and each fourth subpixel group comprises m consecutive second subpixels, where m is an integer greater than or equal to 2.

* * * * *